(12) United States Patent
Niyogi et al.

(10) Patent No.: US 8,361,813 B1
(45) Date of Patent: Jan. 29, 2013

(54) METHOD FOR GENERATING GRAPHENE STRUCTURES

(75) Inventors: Sandip Niyogi, San Jose, CA (US); Sean Barstow, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/315,524

(22) Filed: Dec. 9, 2011

(51) Int. Cl.
*G01R 31/26* (2006.01)
*H01L 21/20* (2006.01)

(52) U.S. Cl. .......... 438/17; 977/842; 977/734; 977/755; 977/831; 977/832; 257/E51.04; 438/584

(58) Field of Classification Search .......... None
See application file for complete search history.

(56) References Cited

U.S. PATENT DOCUMENTS

| 7,894,253 | B2 * | 2/2011 | Kreupl et al. | 365/163 |
| 8,030,637 | B2 * | 10/2011 | Ufert | 257/5 |
| 2009/0321706 | A1 * | 12/2009 | Happ et al. | 257/4 |
| 2012/0168721 | A1 * | 7/2012 | Kelber et al. | 257/29 |

OTHER PUBLICATIONS

Thickness-Dependent Reversible Hydrogenation of Graphene Layers Zhiqiang Luo,†,‡ Ting Yu,† Ki-jeong Kim,§ Zhenhua Ni,† Yumeng You,† Sanhua Lim,‡ Zexiang Shen,† Shanzhong Wang,__ and Jianyi Lin‡, ACS Nano, 2009, 3 (7), pp. 1781-1788 publication Date (Web): Jun. 3, 2009.*
Topological and SP3 Defect Structures, N Nanotubes T. W. Ebbesen' and T. Takada' 'NEC Research Institute, 4 Independence Way, Princeton, NJ 08540, U.S.A. Fundamental Research Laboratories, NEC Corporation, 34 Miyukigaoka, Tsukuba 305, Japan (Received Nov. 25, 1994; accepted Feb. 10, 1995).*

* cited by examiner

*Primary Examiner* — Seahvosh Nikmanesh
*Assistant Examiner* — Evren Seven

(57) ABSTRACT

A method for depositing graphene is provided. The method includes depositing a layer of non-conducting amorphous carbon over a surface of a substrate and depositing a transition metal in a pattern over the amorphous carbon. The substrate is annealed at a temperature below 500° C., where the annealing converts the non-conducting amorphous carbon disposed under the transition metal to conducting amorphous carbon. A portion of the pattern of the transition metal is removed from the surface of the substrate to expose the conducting amorphous carbon.

16 Claims, 5 Drawing Sheets

METHOD FOR GENERATING GRAPHENE STRUCTURES

STATEMENT REGARDING FEDERALLY SPONSORED RESEARCH OR DEVELOPMENT

This invention is based on research sponsored by DARPA/Defense Microelectronics Activity (DMEA) under agreement number H94003-10-2-1003. The United States Government has certain rights to this invention and is authorized to reproduce and distribute reprints for Government purposes, notwithstanding any copyright notation thereon.

BACKGROUND

Graphene is a possible electronic material replacement due to its high carrier mobility and saturation velocity as the search for faster and smaller transistors continues. However, the manufacturing of graphene is not conducive to conventional semiconductor manufacturing techniques as the graphene is typically deposited on a metal substrate and then transferred to a dielectric surface. The transfer is typically performed via a tape, stamp, etc. For example, the transfer can be performed by dissolving the metal in a suitable etching solution while the graphene is immobilized by a layer of polymer such as polymethylmethacrylate (PMMA) and the PMMA-graphene material is transferred to a non-metallic substrate where the PMMA is subsequently removed. This transfer process introduces a host of processing issues and is difficult to reproduce in a uniform manner at the level required for large scale manufacturing in the semiconductor industry. In addition, current techniques for graphene production require a temperature of 900° C. and above. This high temperature requires specialized processing equipment.

It is within this context that the embodiments arise.

SUMMARY

Embodiments of the present invention provide a method and apparatus for generating graphene structures directly on a non-metallic substrate. Several inventive embodiments of the present invention are described below.

In some embodiments, a method for depositing graphene is provided. The method includes depositing a first layer, e.g., a layer of non-conducting amorphous carbon over a surface of a substrate and depositing a second layer, e.g., a transition metal in a pattern over the amorphous carbon. The substrate is annealed at a temperature below 500° C., where the annealing converts the non-conducting amorphous carbon disposed immediately under the transition metal to a third layer, e.g., a conducting crystalline carbon also referred to as graphite carbon. A portion of the pattern of the transition metal is removed from the surface of the substrate to expose the conducting crystalline carbon.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Like reference numerals designate like structural elements.

DETAILED DESCRIPTION

Figure 1:
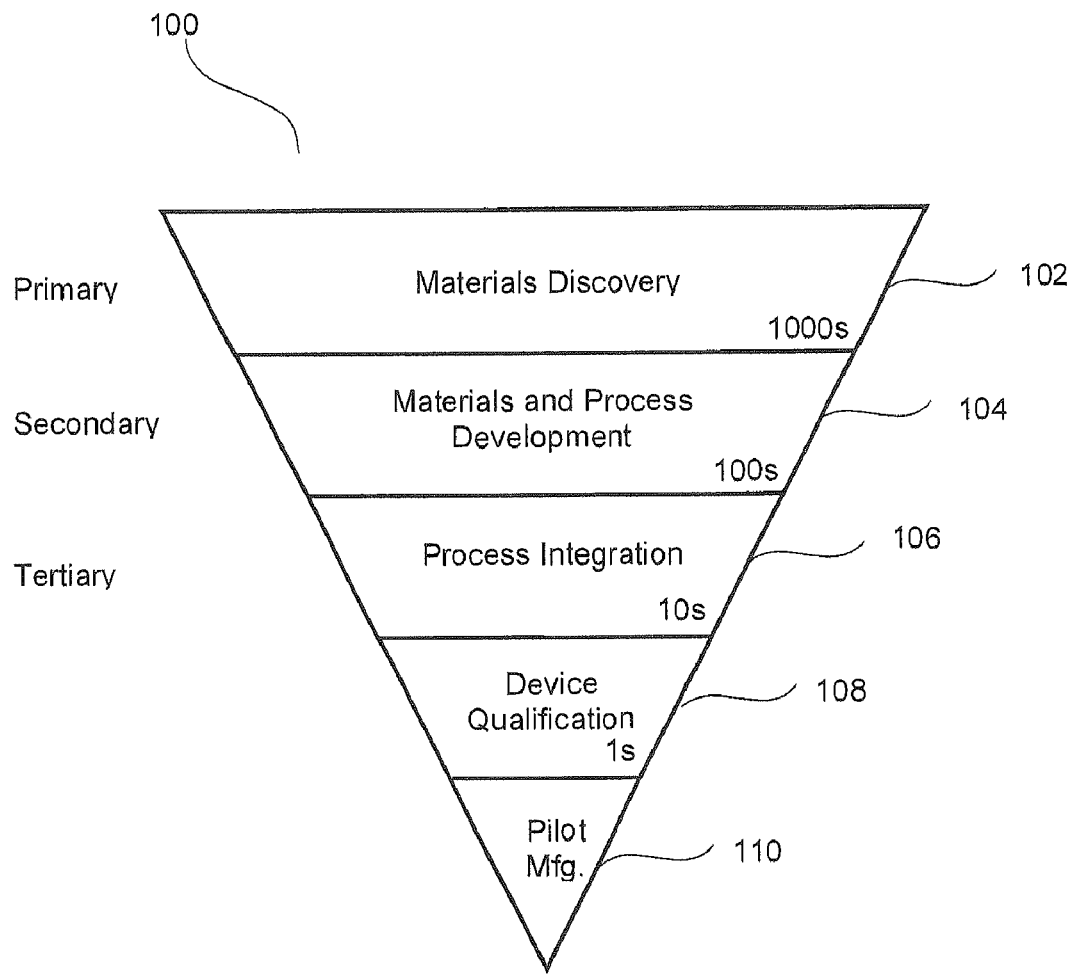
FIG. 1 illustrates a schematic diagram for implementing combinatorial processing and evaluation using primary, secondary, and tertiary screening.

The embodiments described herein provide a method and apparatus for generating graphene on a non-metallic substrate. It will be obvious, however, to one skilled in the art, that the present invention may be practiced without some or all of these specific details. In other instances, well known process operations have not been described in detail in order not to unnecessarily obscure the present invention.

The embodiments describe a method for depositing graphene directly on a dielectric substrate. The technique eliminates the need to transfer the graphene to a dielectric surface from a metallic substrate as is conventionally performed. In the method, non-conducting amorphous carbon containing some amount of hydrogen is deposited as a thin film on a surface of a substrate, such as silicon or silicon dioxide substrate. In some embodiments, non-conducting amorphous carbon refers to carbon having a maximum ratio of $sp^3$ to $sp^2$ bonds of 50% and hydrogen, nitrogen or oxygen atoms may be bonded to the $sp^3$ carbons. As described below, the techniques convert the non-conducting $sp^3$ bonds to conducting $sp^2$ bonds through a relatively low temperature process that is amenable to conventional semiconductor processing techniques. A transition metal, e.g., iron, cobalt or nickel, is deposited over the layer of amorphous carbon, e.g., through a deposition process utilizing shadow masks. The deposited layer is patterned as a crossbar pattern in some embodiments. The substrate in then annealed. In some embodiments, the annealing occurs at a temperature between about 120° C. to about 500° C. In other embodiments, the annealing occurs at a temperature between about 120° C. to about 1200° C. In addition, the temperature ramp rates can range from about 10° C./min-40° C./min and annealing times can range between about 1-60 minutes in some embodiments. The annealing converts the $sp^3$ carbon bonds of the amorphous carbon layer immediately under the transition metal to $sp^2$ carbon bonds through a metal catalyzed mechanism. It should be appreciated that graphene may refer to domains of sp2 bonded carbon with single or multiple graphene layers, with the size of the individual domains determined by the properties of the metal film in some embodiments. The number of graphene layers depends on the thickness of the amorphous carbon film, the metal film thickness and annealing conditions in some embodiments.

A photoresist is disposed over at least a portion of the substrate, e.g., through a spin coat operation, and the photoresist is subsequently developed. A strip operation, e.g., through a wet chemistry operation or other suitable etch operation, is performed to remove the deposited transition metal. In some embodiments, the strip operation is applied to the entire surface of the substrate except an outer peripheral ring of the substrate. This leaves the transition metal on the outer peripheral ring so that there are contact nodes for electrical characterization of the graphene formed below the transition metal and between the contact nodes.

The embodiments described herein may utilize combinatorial processing techniques, which are summarized below. Semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
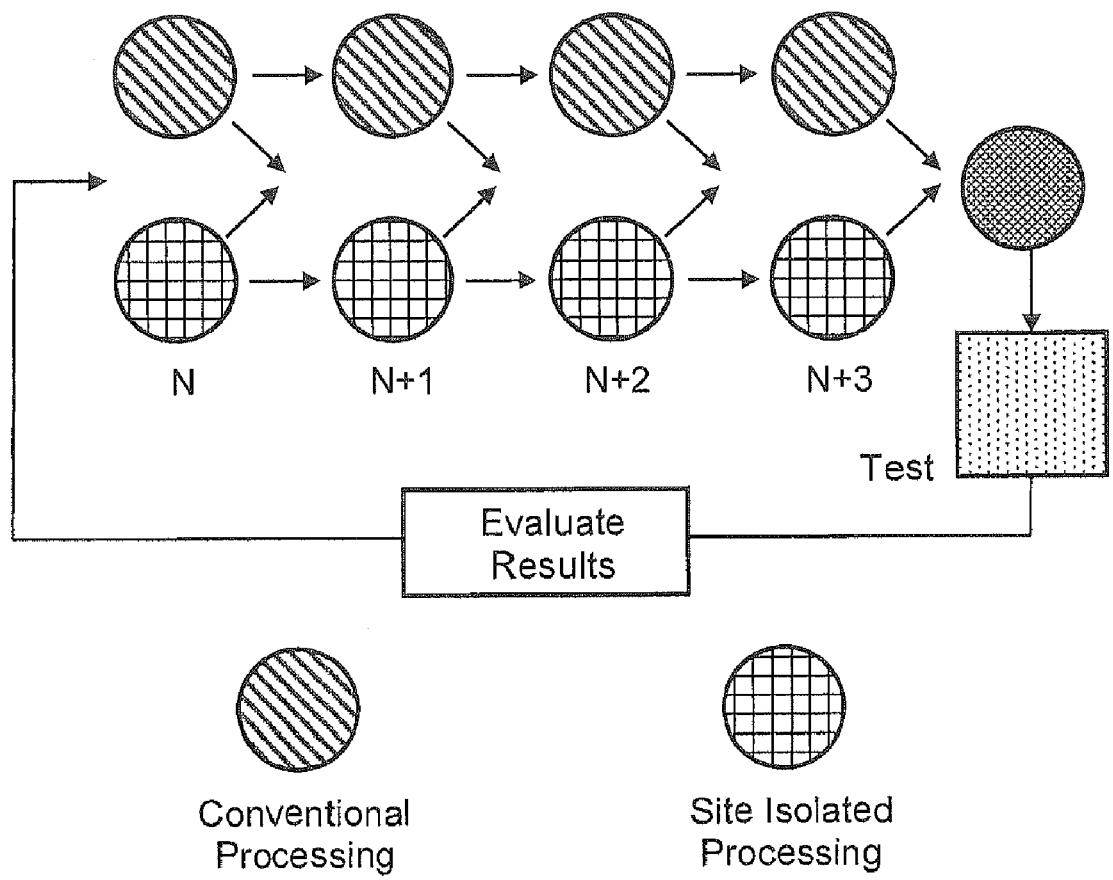
FIG. 2 is a simplified schematic diagram illustrating a general methodology for combinatorial process sequence integration that includes site isolated processing and/or conventional processing in accordance with one embodiment of the invention.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
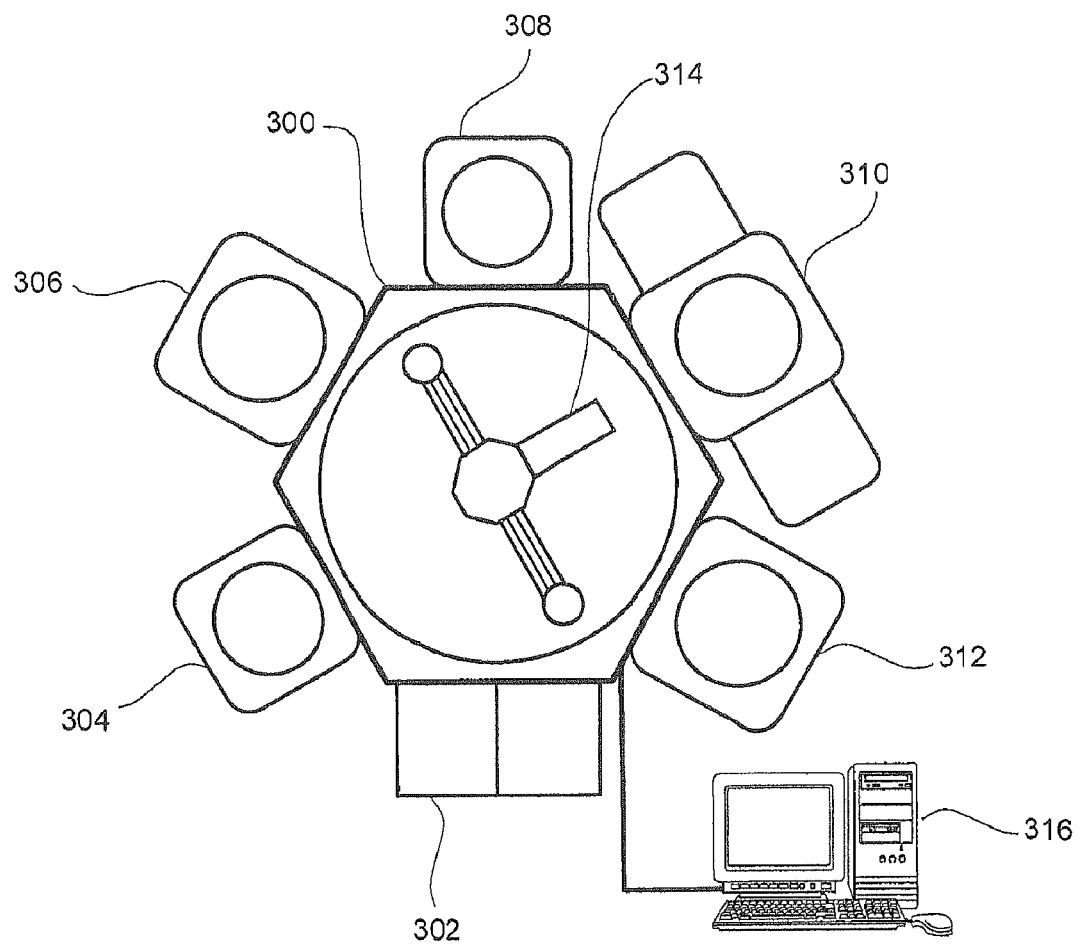
FIG. 3 is a simplified schematic diagram illustrating an integrated high productivity combinatorial (HPC) system in accordance with some embodiments of the invention.

FIG. 3 is a simplified schematic diagram illustrating an integrated high productivity combinatorial (HPC) system in accordance with some embodiments of the invention. HPC system includes a frame 300 supporting a plurality of processing modules. It should be appreciated that frame 300 may be a unitary frame in accordance with some embodiments. In some embodiments, the environment within frame 300 is controlled. Load lock/factory interface 302 provides access into the plurality of modules of the HPC system. Robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system, including the power supplies and synchronization of the duty cycles described in more detail below. Further details of one possible HPC system are described in U.S. application Ser. Nos. 11/672,478 and 11/672,473. With HPC system, a plurality of methods may be employed to deposit material upon a substrate employing combinatorial processes.

Figure 4:
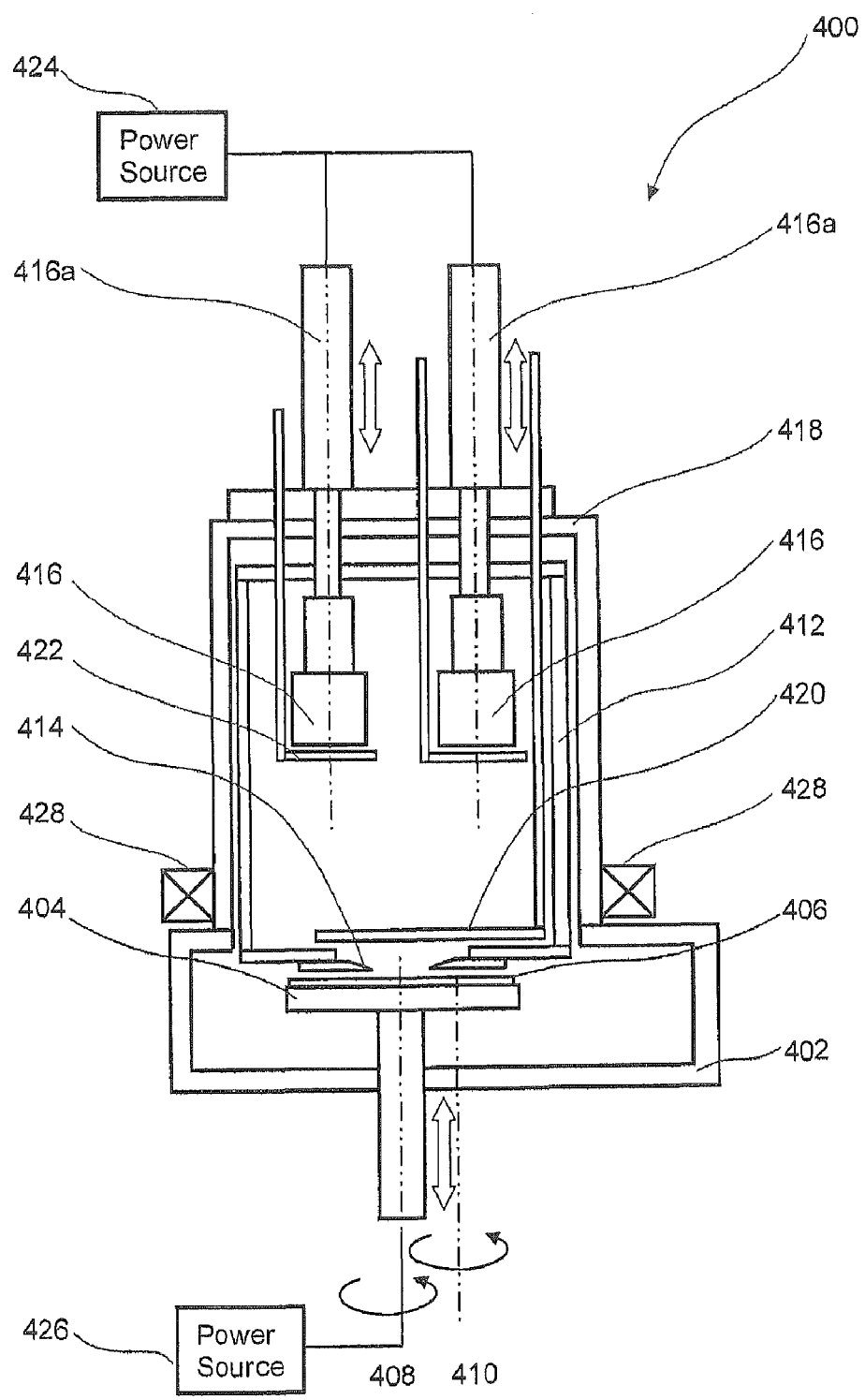
FIG. 4 is a simplified schematic diagram illustrating a sputter processing chamber configured to perform combinatorial processing and full substrate processing in accordance with some embodiments of the invention.

FIG. 4 is a simplified schematic diagram illustrating a sputter chamber configured to perform combinatorial processing and full substrate processing in accordance with some embodiments of the invention. Processing chamber 400 includes a bottom chamber portion 402 disposed under top chamber portion 418. Within bottom portion 402, substrate support 404 is configured to hold a substrate 406 disposed thereon and can be any known substrate support, including but not limited to a vacuum chuck, electrostatic chuck or other known mechanisms. Substrate support 404 is capable of both rotating around its own central axis 408 (referred to as "rotation" axis), and rotating around an exterior axis 410 (referred to as "revolution" axis). Such dual rotary substrate support is central to combinatorial processing using site-isolated mechanisms. Other substrate supports, such as an XY table, can also be used for site-isolated deposition. In addition, substrate support 404 may move in a vertical direction. It should be appreciated that the rotation and movement in the vertical direction may be achieved through known drive mechanisms which include magnetic drives, linear drives, worm screws, lead screws, a differentially pumped rotary feed through drive, etc. Power source 426 provides a bias power to substrate support 404 and substrate 406, and produces a negative bias voltage on substrate 406. In some embodiments power source 426 provides a radio frequency (RF) power sufficient to take advantage of the high metal ionization to improve step coverage of vias and trenches of patterned wafers. In another embodiment, the RF power supplied by power source 426 is pulsed and synchronized with the pulsed power from power source 424. Further details of the power sources and their operation may be found in U.S. patent application Ser. No. 13/281,316 entitled "High Metal Ionization Sputter Gun" filed on Oct. 25, 2011 and is herein incorporated by reference.

Substrate 406 may be a conventional round 200 mm, 300 mm, or any other larger or smaller substrate/wafer size. In other embodiments, substrate 406 may be a square, rectangular, or other shaped substrate. One skilled in the art will appreciate that substrate 406 may be a blanket substrate, a coupon (e.g., partial wafer), or even a patterned substrate having predefined regions. In another embodiment, substrate 406 may have regions defined through the processing described herein. The term region is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field a region may be, for example, a test structure, single die, multiple dies, portion of a die, other defined portion of substrate, or an undefined area of a substrate, e.g., blanket substrate which is defined through the processing.

Top chamber portion 418 of chamber 400 in FIG. 4 includes process kit shield 412, which defines a confinement region over a radial portion of substrate 406. Process kit shield 412 is a sleeve having a base (optionally integrated with the shield) and an optional top within chamber 400 that may be used to confine a plasma generated therein. The generated plasma will dislodge atoms from a target and the sputtered atoms will deposit on an exposed surface of substrate 406 to combinatorial process regions of the substrate in some embodiments. In another embodiment, full wafer processing can be achieved by optimizing gun tilt angle and target-to-substrate spacing, and by using multiple process guns 416. Process kit shield 412 is capable of being moved in and out of chamber 400, i.e., the process kit shield is a replaceable insert. In another embodiment, process kit shield 412 remains in the chamber for both the full substrate and combinatorial processing. Process kit shield 412 includes an optional top portion, sidewalls and a base. In some embodiments, process kit shield 412 is configured in a cylindrical shape, however, the process kit shield may be any suitable shape and is not limited to a cylindrical shape.

The base of process kit shield 412 includes an aperture 414 through which a surface of substrate 406 is exposed for deposition or some other suitable semiconductor processing operations. Aperture shutter 420 which is moveably disposed over the base of process kit shield 412. Aperture shutter 420 may slide across a bottom surface of the base of process kit shield 412 in order to cover or expose aperture 414 in some embodiments. In another embodiment, aperture shutter 420 is controlled through an arm extension which moves the aperture shutter to expose or cover aperture 414. It should be noted that although a single aperture is illustrated, multiple apertures may be included. Each aperture may be associated with a dedicated aperture shutter or an aperture shutter can be configured to cover more than one aperture simultaneously or separately. Alternatively, aperture 414 may be a larger opening and plate 420 may extend with that opening to either completely cover the aperture or place one or more fixed apertures within that opening for processing the defined regions. The dual rotary substrate support 404 is central to the site-isolated mechanism, and allows any location of the substrate or wafer to be placed under the aperture 414. Hence, the site-isolated deposition is possible at any location on the wafer/substrate.

A gun shutter, 422 may be included. Gun shutter 422 functions to seal off a deposition gun when the deposition gun may not be used for the processing in some embodiments. For example, two process guns 416 are illustrated in FIG. 4. Process guns 416 are moveable in a vertical direction so that one or both of the guns may be lifted from the slots of the shield. While two process guns are illustrated, any number of process guns may be included, e.g., one, three, four or more process guns may be included. Where more than one process gun is included, the plurality of process guns may be referred to as a cluster of process guns. Gun shutter 422 can be transitioned to isolate the lifted process guns from the processing area defined within process kit shield 412. In this manner, the process guns are isolated from certain processes when desired. It should be appreciated that slide cover plate 422 may be integrated with the top of the process kit shield 412 to cover the opening as the process gun is lifted or individual cover plate 422 can be used for each target. In some embodiments, process guns 416 are oriented or angled so that a normal reference line extending from a planar surface of the target of the process gun is directed toward an outer periphery of the substrate in order to achieve good uniformity for full substrate deposition film. The target/gun tilt angle depends on the target size, target-to-substrate spacing, target material, process power/pressure, etc.

Top chamber portion 418 of chamber 400 of FIG. 4 includes sidewalls and a top plate which house process kit shield 412. Arm extensions 416a, which are fixed to process guns 416 may be attached to a suitable drive, e.g., lead screw, worm gear, etc., configured to vertically move process guns 416 toward or away from a top plate of top chamber portion 418. Arm extensions 416a may be pivotally affixed to process guns 416 to enable the process guns to tilt relative to a vertical axis. In some embodiments, process guns 416 tilt toward aperture 414 when performing combinatorial processing and tilt toward a periphery of the substrate being processed when performing full substrate processing. It should be appreciated that process guns 416 may tilt away from aperture 414 when performing combinatorial processing in another embodiment. In yet another embodiment, arm extensions 416a are attached to a bellows that allows for the vertical movement and tilting of process guns 416. Arm extensions 416a enable movement with four degrees of freedom in some embodiments. Where process kit shield 412 is utilized, the aperture openings are configured to accommodate the tilting of the process guns. The amount of tilting of the process guns may be dependent on the process being performed in some embodiments.

Power source 424 provides power for sputter guns 416 whereas power source 426 provides RF bias power to an electrostatic chuck to bias the substrate when necessary. It should be appreciated that power source 424 may output a direct current (DC) power supply or a radio frequency (RF) power supply.

Chamber 400 includes auxiliary magnet 428 disposed around an external periphery of the chamber. The auxiliary magnet 428 is located in a region defined between the bottom surface of sputter guns 416 and a top surface of substrate 406. Magnet 428 may be either a permanent magnet or an electromagnet. It should be appreciated that magnet 428 is utilized to provide more uniform bombardment of Argon ions and electrons to the substrate in some embodiments. In addition, auxiliary magnet may be disposed proximate to substrate support 404.

Figure 5:
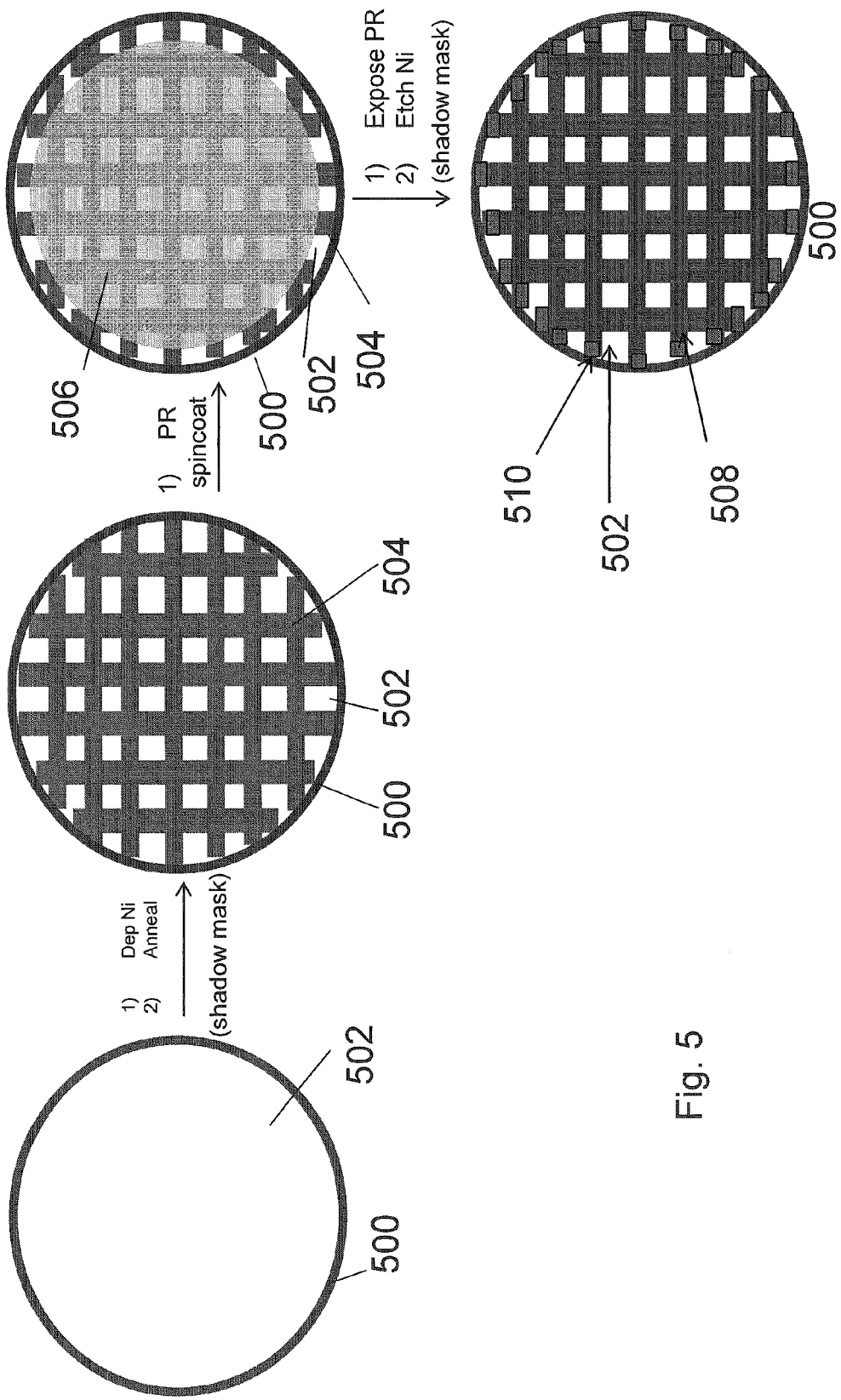
FIG. 5 is a simplified schematic diagram illustrating the process flow for the graphitization of an amorphous carbon layer disposed over any suitable substrate in accordance with some embodiments of the invention.

FIG. 5 is a simplified schematic diagram illustrating the process flow for the graphitization of an amorphous carbon layer disposed over any suitable substrate in accordance with some embodiments of the invention. In the process flow of FIG. 5, substrate 500 is shown initially with a layer of amorphous carbon 502 disposed thereon. It should be appreciated that the amorphous carbon may be deposited through a chemical vapor deposition process in accordance with some embodiments. In some embodiments the amorphous carbon is deposited through a vapor deposition process with the substrate held at a temperature of between about room temperature and about 500° C., which results in a ratio of $sp^3$ to $sp^2$ hybridized bonds of about 10-50%, which is a non-conducting amorphous carbon layer. In addition, while FIG. 5 is explained in relation to substrate 500 having a layer of material disposed over an entirety of the surface of the substrate, this is not meant to be limiting. For example, the embodiments may be integrated into a combinatorial process where rather than an entire substrate having the amorphous carbon layer 502, a plurality of site isolated regions on the substrate may include the amorphous carbon layer 502. In this manner, the techniques and apparatuses described with reference to FIGS. 1-4 may be utilized for the combinatorial process flow to evaluate and identify an optimum process for forming graphene on the substrate.

Through a deposition process on substrate 500, a patterned array of metal lines 504 are deposited over the surface of substrate 500. As used herein, a "pattern" is understood to mean that the material is formed on some regions of the substrate and/or layer and not formed on other regions of the substrate and/or layer. The pattern may be formed by additive techniques such as deposition through a mask, or may be formed by subtractive techniques using well known lithography and etch techniques, or may be formed by combinations of the two techniques. In some embodiments, a vapor deposition process is performed to deposit the array of metal lines 504 on substrate 500 having the amorphous carbon layer 502. Following the deposition of the array of metal lines 504 an annealing process is performed. The annealing process occurs between about 120° C. and about 500° C. in some embodiments. The array of metal lines 504 may be composed of any transition metal. Exemplary metals include nickel, cobalt, and iron in some embodiments. It should be appreciate that while a pattern of intersecting lines is illustrated, this is not meant to be limiting as any alternative pattern or entire region can be deposited. Upon completion of the deposition and annealing process, a photoresist is disposed over region 506 on the surface of the patterned array on substrate 500. The photoresist over region 506 is exposed or developed and the array of metal lines 504 within a region 506 is etched in order to expose the graphene lines 508. In some embodiments, the etching is performed through a plasma enhanced process utilizing a shadow mask, however, alternative etching techniques may be employed. As a result of the exposure of the graphene 508, a plurality of graphitic lines in an amorphous carbon matrix is provided. In addition, metal contact pads 510 are provided around the periphery of substrate 500 and can function as electrodes in order to ascertain the electrical characteristics of the graphene lines 508.

It should be appreciated that the deposition of the transition metal and the subsequent annealing process converts the non-conducting amorphous carbon 502 disposed under the array of intersecting metal lines 504 to a conducting amorphous carbon, e.g., graphene. In some embodiments, the amorphous carbon is dissolved by the transition metal and subsequently re-crystallized during the annealing operation. That is, the amorphous carbon is exposed to the metal, a carbide is formed with the metal where the carbide is unstable and is transformed to graphene during the annealing operation. In some embodiments, the transforming of the non-conducting amorphous carbon layer 502 to a conducting graphene line 508 transforms the non-conducting $sp^3$ hybridization bonds to conducting $sp^2$ hybridization bonds. In other embodiments, the non-conducting amorphous carbon may be composed of 50% $sp^3$ hybridization bonds and 50% $sp^2$ hybridization bonds. In some embodiments, the conducting graphitized carbon contains 100% of $sp^2$ hybridization bonds, i.e., all of the $sp^3$ hybridization bonds are converted to $sp^2$ hybridization bonds. The annealing process occurs at a temperature of less than 500° C. in some embodiments, which allows the process to be accommodated by currently available tools without modification as opposed to specialized tools for operating at temperatures above 900° C. In some embodiments the annealing process is between about 120° C. and about 900° C.

Through the embodiments, the graphene layer may be disposed directly onto any non-metal substrate, including dielectrics and glass, and is not limited to a metal substrate, thereby eliminating the need to transfer the graphene to a non-metal substrate. The embodiments may be integrated with semiconductor processing operations and clean energy techniques. In addition, the edges of the graphene lines 508 are passivated by amorphous carbon regions 502. That is, the edges of the graphene lines 508, which can be unstable, are not exposed and in need of passivation as the edges are already passivated by amorphous carbon regions 502.

Depending on the thickness of the starting amorphous carbon layer and the metal catalyst layer, the graphene layers formed are also intrinsically supported on amorphous carbon. Thus, amorphous carbon acts as the interface between graphene and the dielectric substrate. This interface between graphene and the substrate (silicon oxide most commonly) is known to be responsible for a host of adverse electronic effects on the properties of graphene. The method described herein provides an ideal substrate for graphene due to the intrinsic support.

From the above description it should be appreciated that the embodiments lend themselves to combinatorial processing, where different regions of the substrate can be used to characterize different process conditions, materials, unit processes, etc., for the various deposition and annealing operations described to form the graphene layer.

It is to be understood that the above description is intended to be illustrative and not restrictive. Many embodiments and variations of the invention will become apparent to those of skill in the art upon review of this disclosure. Merely by way of example a wide variety of process times, process temperatures and other process conditions may be utilized, as well as a different ordering of certain processing steps. The scope of the invention should, therefore, be determined not with reference to the above description, but instead should be determined with reference to the appended claims along with the full scope of equivalents to which such claims are entitled.

The embodiments described above provide methods and apparatus for the parallel or rapid serial synthesis, processing and analysis of novel materials having useful properties identified for semiconductor manufacturing processes. Any materials found to possess useful properties can then subsequently be prepared on a larger scale and evaluated in actual processing conditions. These materials can be evaluated along with reaction or processing parameters through the methods described above. In turn, the feedback from the varying of the parameters provides for process optimization. Some reaction parameters which can be varied include, but are not limited to, process material amounts, reactant species, processing temperatures, processing times, processing pressures, processing gas flow rates, processing powers, processing reagent compositions, the rates at which the reactions are quenched, atmospheres in which the processes are conducted, an order in which materials are deposited, etc. In addition, the methods described above enable the processing and testing of more than one material, more than one processing condition, more than one sequence of processing conditions, more than one process sequence integration flow, and combinations thereof, on a single substrate without the need of consuming multiple substrates per material, processing condition, sequence of operations and processes or any of the combinations thereof. This greatly improves the speed as well as reduces the costs associated with the discovery and optimization of semiconductor and other manufacturing operations.

Moreover, the embodiments described herein are directed towards delivering precise amounts of material under precise processing conditions at specific locations of a substrate in order to simulate conventional manufacturing processing operations. As mentioned above, within a region the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes and process sequences may vary. It should be noted that the discrete steps of uniform processing is enabled through the HPC systems described herein.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for depositing graphene, comprising:
   depositing a first layer over a surface of a substrate, wherein the first layer comprises non-conducting amorphous carbon;
   depositing a second layer above the first layer, wherein the second layer is a transition metal and wherein the second layer forms a pattern above the first layer;
   annealing the substrate at a temperature below 500° C., the annealing resulting in converting a portion of the first layer disposed under the second layer to a third layer, wherein the third layer comprises conducting amorphous carbon; and
   removing a portion of the pattern of the second layer from the surface of the substrate to expose the third layer.

2. The method of claim 1, wherein the first layer has a fraction of $sp^3$ to $sp^2$ hybridized carbon bonds of less than 50%.

3. The method of claim 1, wherein the second layer is selected from the group consisting of iron, nickel, cobalt, copper, palladium, vanadium, iridium, platinum, molybdenum, yttrium, aluminium or their alloys.

4. The method of claim 1, wherein the annealing converts $sp^3$ hybridized carbon bonds to $sp^2$ hybridized carbon bonds.

5. The method of claim 1, wherein the annealing converts a portion of the thickness of the first layer to a crystalline $sp^2$ bonded carbon layer supported on the remainder of the original first layer.

6. The method of claim 1, wherein the first layer includes hydrogen.

7. The method of claim 1, wherein the removing includes,
   forming contact pads comprising the second layer along a periphery of the substrate.

8. The method of claim 7, further comprising:
   testing electrical characteristics through the contact pads.

9. A method for depositing graphene, comprising:
   depositing a first layer over a surface of a substrate, wherein the first layer comprises non-conducting amorphous carbon and the first layer contains hydrogen;
   depositing a second layer over the first carbon layer;
   transforming a portion of the first layer under the second layer to a third layer, wherein the third layer comprises graphene; and
   removing the second layer from the surface of the substrate, the removing exposing the third layer.

10. The method of claim 9, wherein the transforming includes,
    converting $sp^a$ hybridization bonds to $sp^2$ hybridization bonds.

11. The method of claim 9, wherein the transforming includes,
    dissolving the first layer; and
    crystallizing the dissolved first layer carbon.

12. The method of claim 11, wherein the crystallizing is achieved by annealing the substrate at a temperature less than about 500° C.

13. The method of claim 9 the substrate is a non-metallic substrate.

14. The method of claim 9 wherein the first layer has a ratio of $sp^a$ to $sp^2$ hybridized bonds of at least 50%.

15. The method of claim 9, wherein the second layer is deposited as an array of intersecting lines.

16. The method of claim 9 wherein the substrate is glass.

* * * * *